United States Patent [19]

Jubb et al.

[11] Patent Number: 4,752,344
[45] Date of Patent: Jun. 21, 1988

[54] MAGNETIC LAYER AND METHOD OF MANUFACTURE

[75] Inventors: Nancy J. Jubb; Timothy M. Reith, both of Tucson, Ariz.

[73] Assignee: International Business Machines Corporation, Armonk, N.Y.

[21] Appl. No.: 942,744

[22] Filed: Dec. 22, 1986

[51] Int. Cl.⁴ .................. C22C 19/03; C22C 38/08; C23C 14/14; G11B 5/31

[52] U.S. Cl. .................. 148/310; 148/312; 420/94; 420/459; 204/192.2

[58] Field of Search ............... 428/614, 928; 420/459, 420/94–98; 204/192.2; 148/310, 312, 315

[56] References Cited

U.S. PATENT DOCUMENTS

| | | | |
|---|---|---|---|
| 3,519,498 | 7/1970 | Ahn | 148/312 |
| 3,567,525 | 3/1971 | Graham et al. | 148/312 |
| 3,653,986 | 4/1972 | Pingel | 420/459 |
| 3,814,598 | 6/1974 | Gabriel et al. | 428/928 |
| 3,843,420 | 10/1974 | Gittleman et al. | 204/192.2 |
| 4,069,043 | 1/1978 | Ackermann | 75/232 |
| 4,153,453 | 5/1979 | Hart et al. | 420/459 |
| 4,239,835 | 12/1980 | Iijima et al. | 428/928 |
| 4,336,066 | 6/1982 | Sata et al. | 75/211 |
| 4,385,098 | 5/1983 | Sugita et al. | 428/928 |
| 4,404,238 | 9/1983 | Baldwin | 427/128 |
| 4,404,263 | 9/1983 | Hodes et al. | 428/632 |
| 4,425,400 | 1/1984 | Yamaguchi et al. | 428/439 |
| 4,460,651 | 7/1984 | Hosaka et al. | 428/402 |
| 4,474,848 | 10/1984 | Yamaguchi | 428/329 |
| 4,610,911 | 9/1986 | Opter et al. | 428/928 |

FOREIGN PATENT DOCUMENTS

| | | | |
|---|---|---|---|
| 69816 | 6/1977 | Japan | 420/459 |
| 6953 | 1/1983 | Japan | 420/459 |
| 61104 | 4/1984 | Japan | 204/192.2 |
| 110755 | 6/1984 | Japan | |
| 112431 | 6/1984 | Japan | 204/192.2 |
| 255953 | 12/1985 | Japan | 420/459 |
| 462655 | 5/1975 | U.S.S.R. | 428/928 |
| 589627 | 1/1978 | U.S.S.R. | 428/928 |

OTHER PUBLICATIONS

K. Y. Ahn et al., "NiFe Films Mixed with SiO₂ for Improved Adhesion", IBM Technical Disclosure Bulletin, vol. 18, No. 10, 3-1976, p. 3513.

E. Kay et al., "Controlled Sputtering Process", IBM Technical Disclosure Bulletin, vol. 12, No. 9, 2-1970, p. 1356.

J. D. Heller, "Wear-Resistant Multilayer Magnetic Film", IBM Technical Disclosure Bulletin, vol. 16, No. 12, 5-1974, p. 3962.

A. J. Collins et al., "The Magnetic Properties of R.F-Sputtered Permalloy and Mumetal Films", Thin Solid Films, 86 (1981), 165–174.

Reith et al., Evaporated NiFe/Al₂O₃ Structure, Aug. 1984, vol. 27, No. 3, p. 1762.

*Primary Examiner*—John J. Zimmerman
*Attorney, Agent, or Firm*—M. W. Schecter; J. Holcombe; M. H. Klitzman

[57] ABSTRACT

An improved thin magnetic layer which is suitable for use in magnetic head pole piece applications and a method of manufacture therefor are disclosed. The magnetic layer is a single phase composition of NiFe and Al₂O₃. The magnetic layer is manufactured by cosputtering from a single, two phase sputtering target, or from separate NiFe and Al₂O₃ sputtering targets. The single phase composition results in increased abrasion resistance without degradation of the magnetic properties of the layer.

7 Claims, 1 Drawing Sheet

MAGNETIC LAYER AND METHOD OF MANUFACTURE

BACKGROUND OF THE INVENTION

1. Field of the Invention

This invention relates to an improved thin magnetic layer and a method of manufacture therefor. More particularly, the invention is an abrasion resistant, single phase composition of nickel-iron and aluminum oxide, and its preparation by cosputtering. The single phase composition is suitable for use in magnetic head pole piece applications.

2. Description of the Relevant Art

It is desirable for materials used in magnetic head pole piece applications to have specific mangetic and mechanical properties. High permeability and low coercivity are desired to maximize magnetic performance of the head. High abrasion resistance is desired to prevent degradation of the magnetic properties through frequent frictional contact with magnetic media. Internal stress is another important mechanical property of the magnetic layer. High tensile or compressive internal stresses of the magnetic layer can cause a loss of mechanical integrity, such as by buckling, cracking, or a loss of adhesion to the underlying magnetic head substrate. It is also desirable that the materials used be capable of easy manufacture. For example, the cost of manufacturing a thin magnetic layer is reduced if it can be deposited in a single in situ process as opposed to a series of deposition steps. Manufacturing costs are also reduced if the materials used can be etched in a single in situ process to allow for easy patterning into a pole piece. Magnetic head pole pieces have been manufactured from several materials, each material having specific drawbacks.

It is known that magnetic head pole pieces can be manufactured from alloys of nickel and iron (hereinafter referred to as NiFe). Although NiFe generally exhibits adequate magnetic properties, it has been found to be susceptible to abrasion from contact with magnetic media and hence lacks durability when used in pole piece applications. Several modifications of NiFe have resulted in increased abrasion resistance.

One such modification of NiFe is the addition of aluminum oxide (hereinafter referred to as $Al_2O_3$) in the form of a layer. More specifically, the pole piece is formed from a laminate of alternating layers of NiFe and $Al_2O_3$. The layers are formed on the magnetic head substrate by either evaporative deposition or sputter deposition. These laminated structures yield pole pieces exhibiting some improvement in wear resistance and magnetic properties compared to magnetic layers manufactured solely from NiFe. However, the laminated structure exhibits little significant improvement in the internal stresses of the magnetic layer and is not easily manufacturable into a pole piece. The layered structure is not capable of easy patterning by an in situ etching process because the alternating layers of NiFe and $Al_2O_3$ require different etchants. Also, the layered structure is difficult to deposit since alternating layer depositions are required.

It has also been proposed to modify NiFe by mixing together particles of NiFe and $Al_2O_3$ and forming them into a magnetic layer by high temperature sintering and then rolling. The magnetic layer is then bonded to the magnetic media head. Although the resulting magnetic layer exhibits some improvement in wear resistance compared to layers made solely from NiFe, this technique is not applicable to the manufacture of thin films.

It is therefore desirable to create a thin magnetic layer and a method of manufacture thereof resulting in improved abrasion resistance without degradation of magnetic properties. In addition, it is desirable that the magnetic layer have the aforementioned characteristics of internal stress and easy manufacturability.

SUMMARY OF THE INVENTION

In view of the foregoing, it is the primary object of this invention to improve thin magnetic layers which are suitable for use in magnetic head pole piece applications, and a method of manufacturing therefor.

Another object of the invention is to increase the abrasion resistance of thin magnetic layers which are suitable for use in magnetic head pole piece applications, and a method of manufacture therefor.

Still another object of the invention is to increase the abrasion resistance of thin magnetic layers which are suitable for use in magnetic head pole piece applications without degradation of the magnetic properties of the layers, and a method of manufacture therefor.

Yet another object of the invention is to increase the abrasion resistance of thin magnetic layers which are suitable for use in magnetic head pole piece applications while allowing for stress characteristics resulting in good mechanical integrity of the layer, and a method of manufacture therefor.

Yet another object of the invention is to increase the abrasion resistance of thin magnetic layers which are suitable for use in magnetic head pole piece applications while allowing for easy manufacturability of the layers, and a method of manufacture therefor.

These and other objects of the invention are achieved by forming a thin magnetic layer of a single phase composition of NiFe and $Al_2O_3$ by cosputtering. The magnetic layer may be cosputtered from a single, two phase sputtering target, or from separate NiFe and $Al_2O_3$ sputtering targets.

DESCRIPTION OF THE PREFERRED EMBODIMENTS

Figure 1:
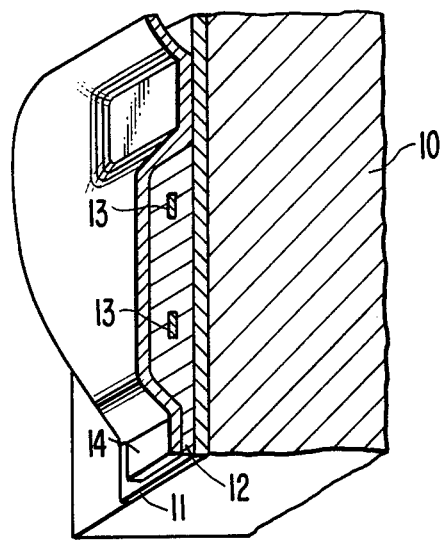
FIG. 1 is a sectional view of a thin film magnetic head, cut away through the center, illustrating the two magnetic pole pieces.

The invention described herein is useful in thin film magnetic heads such as will now be described with reference to FIG. 1. Nonmagnetic substrate 10 supports pole piece 11. Insulating layer 12 and a coil structure including an electrical conductor pattern represented by blocks 13 are formed over pole piece 11. Second pole piece 14 is spaced from pole piece 11 by insulating layer 12, the two pole pieces enclosing the transducing gap formed by the insulating layer.

1. Material Composition

The mechanical and magnetic properties of $(NiFe)_{1-x}(Al_2O_3)_x$ alloys can be altered by changing the structure and relative proportions of NiFe and $Al_2O_3$. In this manner, the material properties of a thin magnetic layer of the alloy are made suitable for use in magnetic head pole piece applications. For example, single phase structures provide for improved abrasion resistance. These single phase structures can be created by cosputtering NiFe and $Al_2O_3$, as will be discussed later herein. Also, as the relative proportion of $Al_2O_3$ increases, the abrasion resistance of the material improves and the magnetic properties degrade. Above approximately 50 atomic percent $Al_2O_3$ the composition exhibits significantly degraded magnetic properties, as necessary for use in magnetic head pole piece applications. Thus, in the preferred embodiment of the invention, the thin magnetic layer is a single phase composition of $(NiFe)_{1-x}(Al_2O_3)_x$ wherein x does not exceed 0.5.

The single phase structure and composition of the aforementioned preferred embodiment allows for thin magnetic layers superior in abrasion resistance compared to those of simple NiFe or laminated NiFe and $Al_2O_3$. Maintaining the aforementioned relative proportions of NiFe and $Al_2O_3$ in the single phase composition also allows for magnetic properties comparable to those exhibited by laminated NiFe and $Al_2O_3$ compositions and superior to those exhibited by simple NiFe alloys. In addition, the internal stresses are less in the single phase composition than in the other compositions. As the relative proportion of $Al_2O_3$ in the single phase composition increases, the internal stresses are reduced, thereby improving the mechanical integrity of the magnetic layer. The substrate can be a variety of materials, such as ferrite, sapphire, or a two phase composition of TiC and $Al_2O_3$. Finally, the single phase composition is easily manufactured. Deposition is made in a single in situ process. In situ etching is also possible, allowing for easy patterning of the magnetic layer into a pole piece during the later stages of manufacture.

$Al_2O_3$ is not the only material which can be combined with NiFe in a single phase composition to produce improved thin magnetic layers. Single phase compositions of NiFe and metal oxides, metal nitrides, metal carbides, or any compound of a metal and a non-metal which does not fractionate when cosputtered with NiFe are also suitable. Rutherford backscattering can be used to determine whether fractionation has occurred. Fractionation of the compound during cosputtering results in the non-metal components reacting with the NiFe, thereby degrading the resulting magnetic properties of the material. For example, $Ta_2O_5$ fractionates into TaO during cosputtering with NiFe, the liberated oxygen reacting with the NiFe. Very small amounts of free oxygen (less than 2%) result in significant degradation of the magnetic properties of NiFe. Another material which fractionates during cosputtering with NiFe is $SiO_2$. Materials theorized not to fractionate when cosputtered with NiFe (under the proper conditions) are $TiO_2$ and $ZrO_2$. Thus, $TiO_2$ and $ZrO_2$ are suitable substitutes for $Al_2O_3$ in the above description.

2. Method of Manufacture

Figure 2:
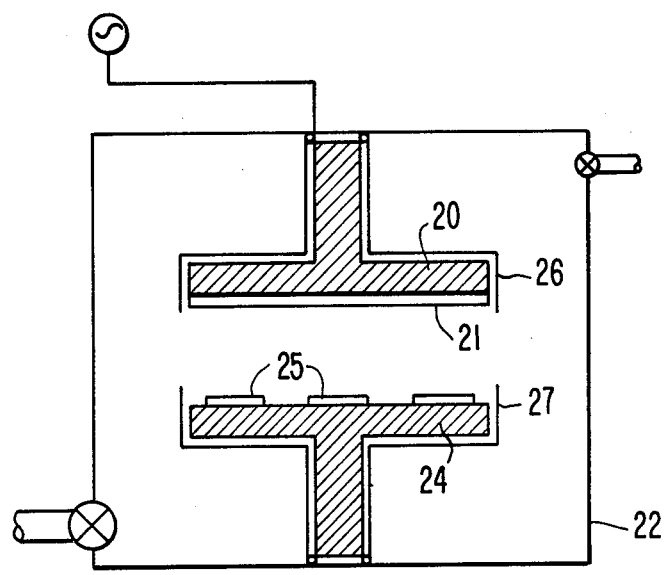
FIG. 2 is a sectional view of a sputtering apparatus.

Single phase compositions of $(NiFe)_{1-x}(Al_2O_3)_x$ can be manufactured by codepositing NiFe and $Al_2O_3$, such as by cosputtering. A single two phase sputtering target or separate sputtering targets for each material can be used. Sputtering may be accomplished in rf diode or rf magnetron sputtering systems. A suitable sputtering system is shown in FIG. 2. Target electrode 20, to which target 21 is mounted, is positioned within vacuum chamber 22. Substrate electrode 24 is fixed adjacent to and facing target electrode 20. Substrates 25 are placed upon substrate electrode 24. The peripheral and back portions of the electrodes are surrounded by ground shields 26 and 27 to prevent spurious sputtering at the back of the electrode.

An example of suitable sputtering conditions will now be described. 6 micron thick single phase compositions of NiFe and $Al_2O_3$ have been cosputtered on to a ferrite substrate in a Perkin-Elmer rf diode, planar sputtering system. Two separate sputtering targets were used, one target being high purity NiFe and the other target being high purity $Al_2O_3$. The sputtering targets were set approximately 2.5 inches above the substrate pallet. The rotation speed of the pallet was set at approximately 5 revolutions per minute, allowing only a few monolayers of the magnetic layer to be deposited during each revolution. An rf substrate bias up to 200 volts was applied, the gas pressure of the system was varied between 5 and 25 millitorrs, and the temperature of the system was allowed to come to equilibrium. The temperature reached no higher than about 200 degrees Centigrade during deposition. The rf generator was set to supply a total of 2 kilowatts of power. The power was split between the targets so as to allow for the desired deposition rates of each material. If NiFe and $Al_2O_3$ had been sputtered separately under these conditions, the depositions rates would have been approximately 60 and 20 angstroms per minute respectively. The resulting deposition rate of the single phase composition was approximately 50 angstroms per minute. No post deposition treatment was needed to achieve adequate mechanical and magnetic properties. The single phase composition contained approximately 10 atomic percent of $Al_2O_3$, as measured by Rutherford backscattering.

While the invention has been described with respect to a preferred and alternative embodiment thereof, it will be understood by those skilled in the art that various changes in detail may be made therein without departing from the spirit, scope, and teaching of the invention. For example, it is known that excess oxygen in the sputtering environment can be incorporated into the single phase composition deposited. Thus, although $Al_2O_3$ is used in the sputtering target, the final composition of the magnetic layer in the above description may actually be $(NiFe)_{1-x}(Al_2O_z)_x$, where z is 3 or greater. Similar changes may also occur when other materials are substituted for $Al_2O_3$, as previously described. In addition, the invention may be used in any type of magnetic head having magnetic pole pieces and should therefore not be limited by that shown in FIG. 1. Similarly, the sputtering system shown in FIG. 2 is exemplary and should not be considered to limit the invention. Accordingly, the magnetic layer compositions and methods of manufacture disclosed are to be limited only as specified in the following claims.

What is claimed is:

1. A thin magnetic layer suitable for use in a magnetic head pole piece comprising a single phase composition of NiFe and a compound of a metal and a non-metal, said compound having been codeposited with NiFe without fractionating.

2. The magnetic layer of claim 1 wherein said compound is $Al_2O_3$.

3. The magnetic layer of claim 2 wherein said $Al_2O_3$ comprises no more than 50 atomic percent of said single phase composition.

4. The magnetic layer of claim 1 wherein said compound is $TiO_2$.

5. The magnetic layer of claim 1 wherein said compound is $ZrO_2$.

6. A method of manufacturing a single phase magnetic layer suitable for use in a magnetic head pole piece, comprising:
   providing a substrate upon which the magnetic layer is to be deposited;
   providing a first target of NiFe and a second separate target of a compound of a metal and a non-metal; and,
   cosputtering NiFe and the compound without fractionating to form the single phase magnetic layer on the substrate.

7. A method of manufacturing a single phase magnetic layer suitable for use in a magnetic head pole piece, comprising:
   providing a substrate upon which the magnetic layer is to be deposited;
   providing a two phase target of NiFe and a compound of a metal and a non-metal; and
   cosputtering NiFe and the compound without fractionating to form the single phase magnetic layer on the substrate.

* * * * *